(12) United States Patent
Lee et al.

(10) Patent No.: US 6,924,984 B2
(45) Date of Patent: Aug. 2, 2005

(54) HEAT SINK CLIP WITH PIVOTING LOCKING PORTIONS

(75) Inventors: Hsieh Kun Lee, Tu-chen (TW); Cheng-Tien Lai, Tu-Chen (TW); Tony Zhou, Shenzhen (CH)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 71 days.

(21) Appl. No.: 10/660,425

(22) Filed: Sep. 10, 2003

(65) Prior Publication Data

US 2004/0125567 A1 Jul. 1, 2004

(30) Foreign Application Priority Data

Dec. 31, 2002 (TW) ...................................... 91221599 U

(51) Int. Cl.$^7$ ............................................... H05K 7/20
(52) U.S. Cl. ........................... 361/704; 24/458; 24/296; 165/80.3; 165/185; 257/719; 248/510; 361/707; 361/710; 361/719
(58) Field of Search .......................... 24/294–297, 625, 24/457–458; 165/80.3, 185; 257/718–719, 726–727; 268/505, 510; 176/16.3; 361/704, 707, 709–710, 719–721

(56) References Cited

U.S. PATENT DOCUMENTS

| | | | | |
|---|---|---|---|---|
| 6,049,457 A | * | 4/2000 | Lee | ............................. 361/704 |
| 6,404,633 B1 | * | 6/2002 | Hsu | ............................. 361/703 |
| 6,496,371 B2 | | 12/2002 | Winkel et al. | |
| 6,522,545 B2 | | 2/2003 | Shia et al. | |
| 6,542,367 B2 | | 4/2003 | Shia et al. | |
| 6,574,109 B1 | * | 6/2003 | McHugh et al. | ............. 361/719 |
| 6,728,107 B2 | * | 4/2004 | Tseng et al. | ................. 361/719 |

* cited by examiner

Primary Examiner—Gregory Thompson
(74) Attorney, Agent, or Firm—Wei Te Chung

(57) ABSTRACT

A heat sink clip comprises a connecting member (12), two pressing members (14) connecting to the connection member, each of the pressing members comprising a pressing portion (141) and two spring portions (142, 143) extending from opposite ends of the pressing portion, a first locking portion (144) depending from one of the spring portions of each pressing member, two operating members (16) each having spaced first and second pivot means, the second pivot means being below the first pivot means, the operating members respectively pivotably connected to the other one of the spring portions, and two second locking portions (18) respectively pivotably connected to the operating members. When the operating members are rotated downwardly, the first and second locking portions are raised, adapted for engaging with a retention frame and securing a heat sink to an electronic package.

21 Claims, 4 Drawing Sheets

HEAT SINK CLIP WITH PIVOTING LOCKING PORTIONS

BACKGROUND OF THE INVENTION

1. Field of the Invention

The present invention relates to securing of heat sinks to electronic packages, and particularly to a heat sink clip with pivoting locking portions for readily and securely retaining a heat sink to an electronic package.

2. Prior Art

In order to control heat produced by high-powered computer Central Processing Units (CPUs) such as the Pentium IV produced by Intel(R) and the K8 produced by AMD(R), bigger and heavier heat sinks are becoming increasingly necessary. Strong resilient clips are often used to attach these heat sinks onto electronic packages.

An example of this kind of heat sink clip is shown in FIG. 5. The clip is usually integrally formed from a sheet of plastic or steel. The clip comprises a main body 100 and an operator 200. The main body 100 comprises a central pressing portion 120, and two resilient portions extending outwardly and upwardly from opposite sides of the pressing portion 120. A locking portion 140 depends from a distal end of one of the resilient portions. A first locking hole 160 is defined in the locking portion 140. The operator 200 is pivotably attached to the other resilient portion via a slot 220 defined in the operator 200. A second locking hole 240 is defined in the operator 200. When the clip is used to press a heat sink 300 onto a CPU 400 mounted on a socket 500, the clip is positioned over the heat sink 300. The pressing portion 120 is positioned in a channel 320 defined in a center of the heat sink 300, and the first locking hole 160 loosely receives a first corresponding catch 520 formed on the socket 500. The operator 200 is urged downward, the second locking hole 240 engagingly receives a second corresponding catch 520 formed on the socket 500, and the first corresponding catch 520 is engaged in the first locking hole 160.

However, the clip is relatively rigid. A user must exert considerable force to cause the resilient portions to elastically deform, which is cumbersome and time-consuming. In addition, a tool must be used to detach the clip from the socket 500. It is inconvenient to use a tool, especially within the limited confines of a typical computer case. Furthermore, the tool can easily skid off the clip, causing damage to adjacent components in the computer case. These difficulties slow down the processes of attachment and detachment of the heat sink to and from the CPU, and result in inefficiency in mass production facilities.

Thus, an improved heat sink clip which overcomes the above-mentioned problems is desired.

BRIEF SUMMARY OF THE INVENTION

Accordingly, an object of the present invention is to provide a heat sink clip with convenient locking portions for readily and securely attaching a heat sink to an electronic package, and for readily detaching the heat sink therefrom.

Another object of the present invention is to provide a heat sink clip assembly which facilitates manual operation thereof.

To achieve the above-mentioned objects, a heat sink clip of the present invention for attaching a heat sink to an electronic package comprises a connecting member, two pressing members connecting to the connection member, each of the pressing members comprising a pressing portion and two spring portions extending from opposite ends of the pressing portion, a first locking portion depending from one of the spring portions of each pressing member, two operating members each having spaced first and second pivot means, the second pivot means being below the first pivot means, the operating members respectively pivotably connected to the other one of the spring portions of the pressing members at the second pivot means, and two second locking portions respectively pivotably connected to the operating members at the first pivot means. When the operating members are rotated downwardly, the first and second locking portions are raised, adapted for engaging with a retention frame and securing a heat sink to an electronic package.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
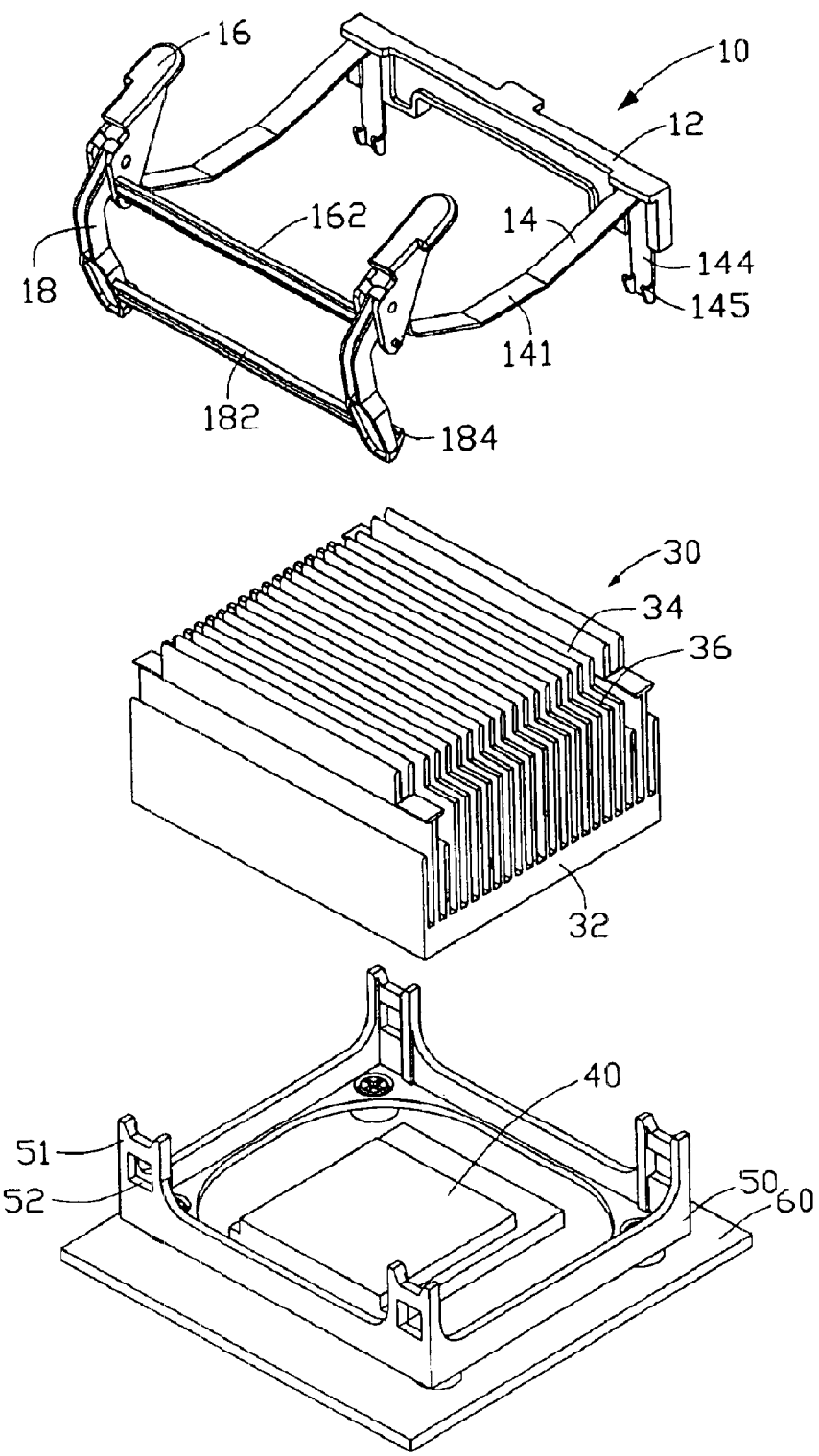
FIG. 1 is an exploded view of a heat sink clip assembly including a heat sink clip in accordance with the present invention.
Figure 2:
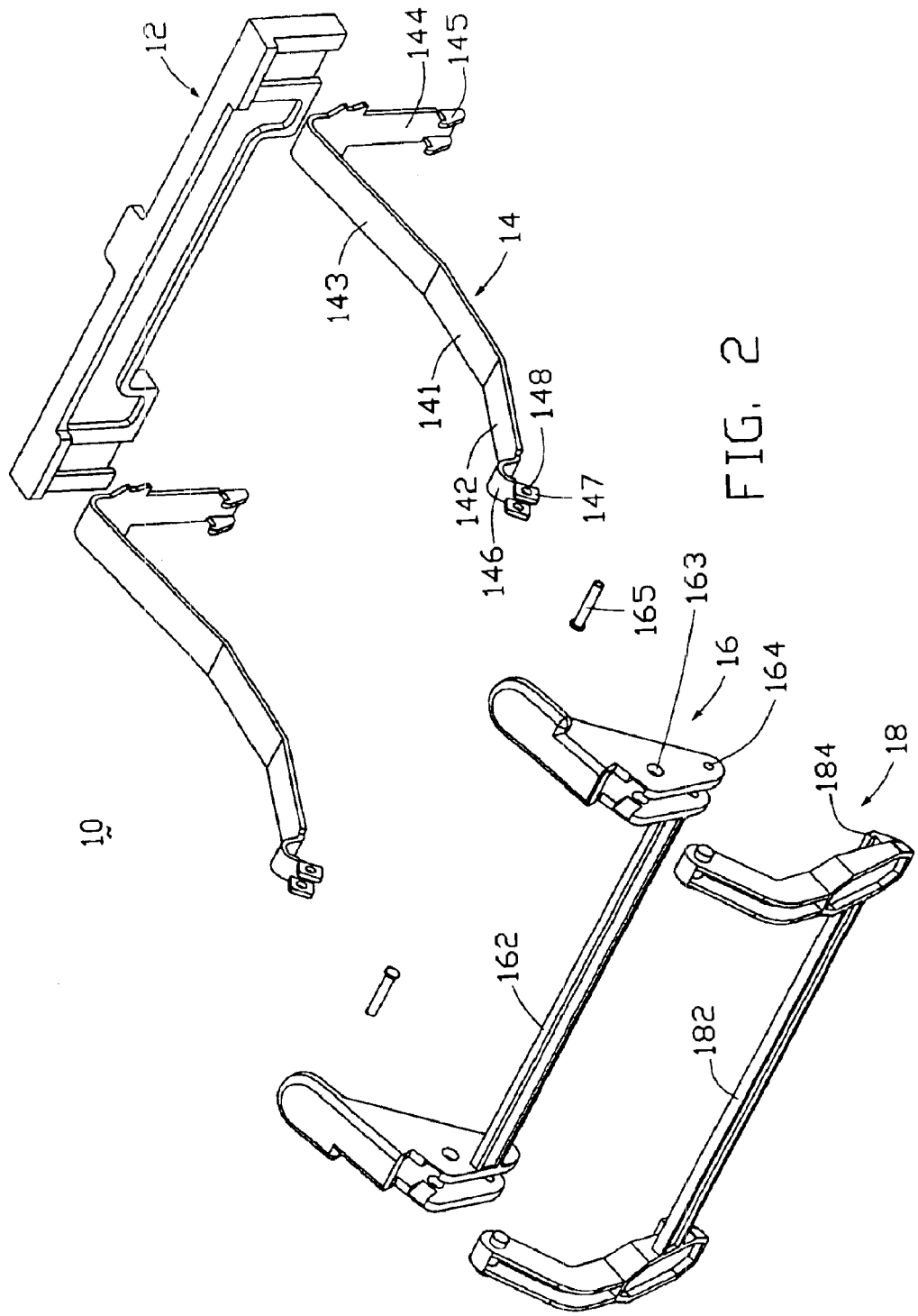
FIG. 2 is an enlarged, exploded view of the clip of FIG. 1.

Referring to FIGS. 1 and 2, a heat sink clip 10 in accordance with the present invention is used to press a heat sink 30 onto an electronic package 40 that is mounted on a printed circuit board (PCB) 60.

The heat sink 30 comprises a base 32, and a plurality of parallel fins 34 extending upwardly from the base 32. Two steps 36 are defined at opposite sides of a top portion of the heat sink 30 respectively. The steps 36 are lower than tops of the fins 34.

A retention frame 50 is attached to the PCB 60 around the electronic package 40. The retention frame 50 is rectangular, and has four arms 51 extending upwardly from four corners thereof respectively. Four through holes 52 are respectively defined in the arms 51. For improving a strength and avoiding deformation of the PCB 60, a back plate (see FIG. 3) can be employed to support the PCB 60.

The clip 10 comprises a connecting beam 12, two parallel pressing beams 14, two operating members 16, and two second locking portions 18. The pressing beams 14 are made of metal. The connecting beam 12, the operating members 16 and the second locking portions 18 are all made of plastic. Two slots (not labeled) are defined in two ends of the connecting beam 12 respectively, for engagingly receiving the pressing beams 14.

Each pressing beam 14 comprises a central pressing portion 141, and first and second spring portions 142, 143 extending outwardly and upwardly from opposite ends of the pressing portion 141 respectively. A first arm 144 depends from a distal end of the second spring portion 143. Two first hooks 145 are formed inwardly at a bottom end of the first arm 144, for engaging in a corresponding through hole 52 of the retention frame 50. An arch-shaped portion 146 is formed at a distal end of the first spring portion 142. Two parallel tabs 147 are outwardly formed at opposite side edges of a free end of the arch-shaped portion 146 respectively. A first pivot hole 148 is defined in each tab 147.

The operating members 16 are parallel to each other, and are integrally interconnected by a first crossbeam 162. Each operating member 16 is generally L-shaped. A pair of aligned second pivot holes 163 and a pair of aligned third pivot holes 164 are defined in one side of the operating member 16. The second pivot holes 163 are at an elbow of the operating member 16, for engagement of a corresponding second locking portion 18 thereat. The third pivot holes 164 are below the second pivot holes 163, and correspond to the first pivot holes 148 of a respective pressing beam 14. Each operating member 16 is pivotably attached to a respective pressing beam 14 by inserting a pivot post 165 through the first and third pivot holes 148, 164.

The second locking portions 18 are parallel to each other, and are integrally interconnected by a second crossbeam 182. Two second hooks 184 are inwardly formed at bottom ends of the second locking portions 18 respectively, for engaging in corresponding holes 52 of the retention frame 50. Top ends of the second locking portions 18 are pivotably engaged in the second pivot holes 163 of the operating members 16.

Figure 3:
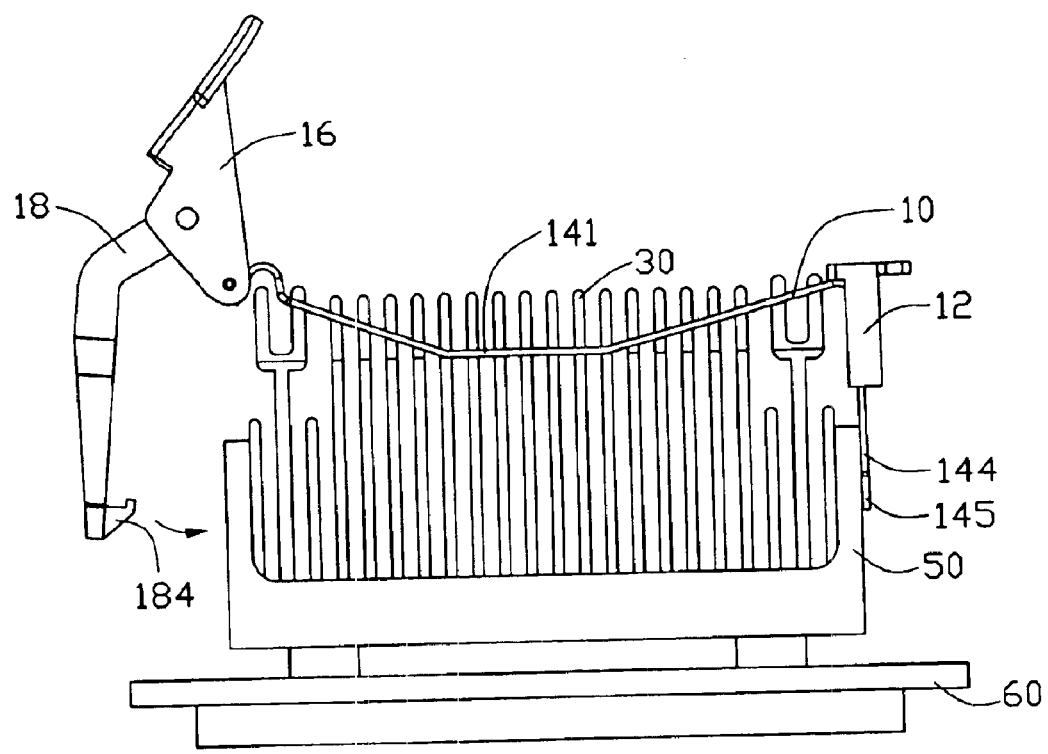
FIG. 3 is a side elevation, partly assembled view of the heat sink clip assembly of FIG. 1, showing the clip in an unlocked position.

Referring to FIG. 3, in use, the heat sink 30 is placed onto the electronic package 40, and is surrounded by the retention frame 50. The clip 10 is placed over the heat sink 30, with the pressing beams 14 resting on the steps 36 of the heat sink 30. The operating members 16 are oriented generally vertically, in respective unlocked positions. The first hooks 145 of the pressing beams 14 are loosely engaged in the corresponding holes 52 of the retention frame 50. The second hooks 184 are loosely received in the corresponding holes 52 of the retention frame 50.

Figure 4:
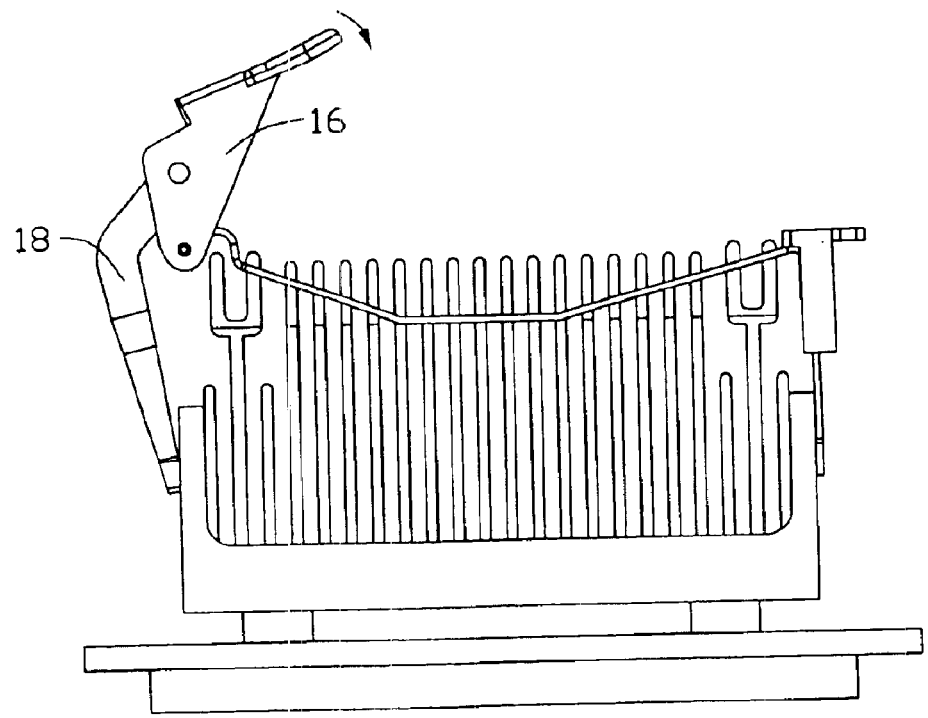
FIG. 4 is similar to FIG. 3, but showing the heat sink clip assembly fully assembled, and the clip in a locked position.
Figure 5:
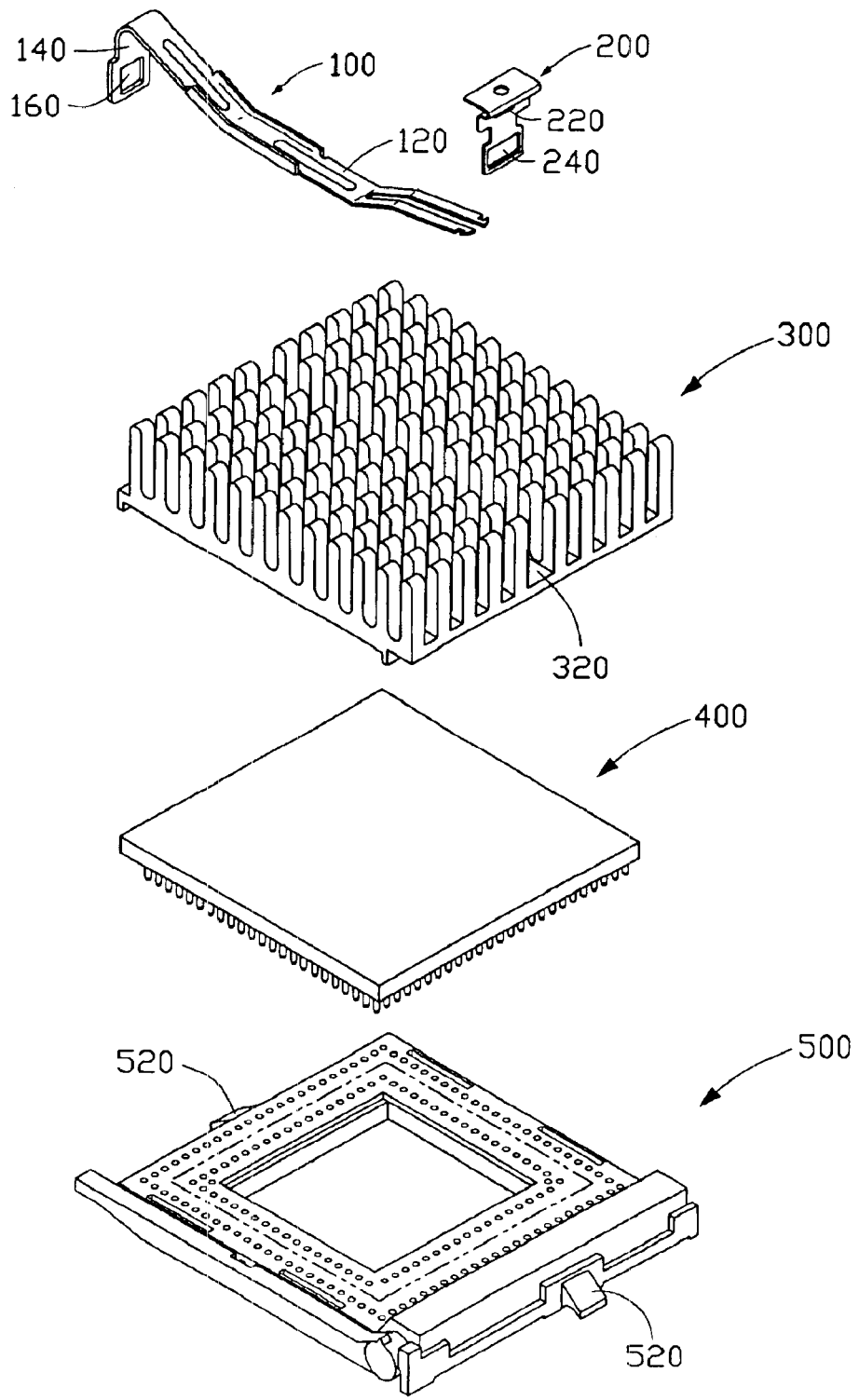
FIG. 5 is an exploded view of a conventional heat sink clip assembly including a heat sink clip.

Referring to FIG. 4, the operating members 16 are rotated downwardly until they reach respective locked positions. The pressing portions 141 of the pressing beams 14 resiliently press the steps 36 of the heat sink 30. The second locking portions 18 are pulled upward, so that the first and second hooks 145, 184 firmly engage in the corresponding holes 52 of the retention frame 50. In this locked position, the operating members 16 bear clockwise forces. This ensures that the operating members 16 remain stably in position.

Removal of the clip 10 is essentially a reverse of the above-described procedure. The operating members 16 are rotated upwardly to release the engagement between the clip 10 and the retention frame 50. The first and second hooks 145, 184 return to their former positions loosely engaged in the corresponding holes 52 of the retention frame 50. The clip 10 is then easily removed from the heat sink 30.

One optimal feature of the invention is to provide a hybrid type clip including the pressing beam 14 made form metal and extending in a first direction with superior resiliency in the vertical direction, and the connection beam 12, the operation member 16 and the locking portion 18 all made of plastic and extending in a second direction perpendicular to said first direction with inferior resiliency but superior rigidity. Under this arrangement, such a hybrid type clip provides both better resiliency and reliable securement as well as material saving.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip for attaching a heat sink to an electronic package that is mounted on a printed circuit board, the heat sink clip comprising:

two pressing members each comprising a pressing portion and two spring portions extending from opposite ends of the pressing portion, a first locking portion depending from one of the spring portions;

a connecting member connecting the pressing members;

two operating members each having spaced first and second pivot means, the second pivot means being below the first pivot means, the operating members respectively pivotably connected to the other one of the spring portions of the pressing members at the second pivot means; and two second locking portions respectively pivotably connected to the operating member at the first pivot means, wherein when the operating members are rotated downwardly, the first and second locking portions are raised, adapted for engaging with a retention frame and securing the heat sink to the electronic package.

2. The heat sink clip as described in claim 1, wherein the pressing members are made of metal, and the connecting member is made of plastic.

3. The heat sink clip as described in claim 1, wherein the first and second locking portions respectively comprise hooks.

4. The heat sink clip as described in claim 1, wherein the first and second pivot means of the operating members respectively comprise pivot holes.

5. The heat sink clip as described in claim 1, wherein the two operating members are parallel to each other, and are integrally interconnected by a first crossbeam.

6. The heat sink clip as described in claim 1, wherein the two second locking portions are parallel to each other, and are integrally interconnected by a second crossbeam.

7. The heat sink clip as described in claim 1, wherein two tabs are formed at a free end of said other one of the spring portions of each pressing member, and each of the tabs defines a first pivot hole.

8. A heat sink clip assembly comprising:

a circuit board;

an electronic package mounted on the circuit board;

a retention frame attached to the circuit board around the electronic package;

a heat sink attached onto the electronic package, the heat sink having a base and a plurality of fins extending upwardly from the base; and a heat sink clip attaching the heat sink to the electronic package, the clip comprising a connecting member, two pressing members connecting to the connection member, each pressing member comprising a pressing portion and two spring portions extending from opposite ends of the pressing portion, a first locking portion depending from one of the spring portions of each pressing member, an operating member pivotably connected to the other one of the spring portions of each pressing member, and a second locking portion pivotably connected to the corresponding operating member, wherein when the operating members are rotated downwardly, the first and second locking portions are raised, so that the first and second locking portions are respectively engaged with the retention frame and the heat sink is thereby secured to the electronic package.

9. The heat sink clip assembly as described in claim 8, wherein each of the operating members has first and second pivot means, and the second pivot means is below the first pivot means.

10. The heat sink clip assembly as described in claim 9, wherein each of the operating members has a handle for facilitating manual operation.

11. The heat sink clip assembly as described in claim 9, wherein the second locking portions are pivotably connected to the operating members at the first pivot means.

12. The heat sink clip assembly as described in claim 9, wherein the first locking portions are pivotably connected to the operating members at the second pivot means.

13. The heat sink clip assembly as described in claim 9, wherein the first and second pivot means of the operating members respectively comprise pivot holes.

14. The heat sink clip assembly as described in claim 8, wherein the first and second locking portions respectively comprise hooks.

15. The heat sink clip assembly as described in claim 8, wherein the retention frame is rectangular, and has four arms extending upwardly from four corners thereof.

16. The heat sink clip assembly as described in claim 15, wherein the first and second locking portions are respectively engaged in four holes respectively defined in the arms of the retention frame.

17. The heat sink clip assembly as described in claim 8, wherein the pressing members are made of metal, and the connecting member and the operating members are made of plastic.

18. A heat sink assembly comprising:
   a printed circuit board;
   an electronic package sub-assembly mounted on the printed circuit board;
   a retention module positioned on the printed circuit board and surrounding said electronic package sub-assembly;
   a heat sink seated upon the electronic package sub-assembly;
   a hybrid type fastening clip located upon the heat sink, said clip including:
   a pair of spaced pressing members made from relatively resilient material and essentially extending in a first direction with superior deflectability in a vertical direction perpendicular to said first direction;
   a connection beam made from relatively rigid material connected between said pair of pressing members on one side of said clip and extending in a second direction perpendicular to both said first direction and said vertical direction so as to prevent relative movement between said pair of pressing members in said second direction on said side of the clip; and
   an operating member and an associated locking portion commonly connected between said pair of pressing members on the other side of the clip and extending in said second direction so as to prevent relative movement between said pair pressing members in said second direction on said other side of the clip; whereby
   the clip is formed with not only better resiliency in the vertical direction but also better rigidity of a whole structure thereof.

19. The assembly as described in claim 18, wherein said locking portion is latched to the retention module.

20. The assembly as described in claim 18, wherein said pressing member further includes another locking portion latched to the retention module.

21. The assembly as described in claim 18, wherein said operating member and said locking portion are discrete from each other under a condition that said operating member is pivotally mounted to the pressing member and said locking portion is pivotally mounted to the operating member.

* * * * *